(12) United States Patent  (10) Patent No.: US 7,645,147 B2
Dittmann                    (45) Date of Patent:     Jan. 12, 2010

(54) ELECTRICAL CONNECTOR HAVING A FLEXIBLE SHEET AND ONE OR MORE CONDUCTIVE CONNECTORS

(75) Inventor: Larry E. Dittmann, Middletown, PA (US)

(73) Assignee: Neoconix, Inc., Sunnyvale, CA (US)

( * ) Notice: Subject to any disclaimer, the term of this patent is extended or adjusted under 35 U.S.C. 154(b) by 112 days.

(21) Appl. No.: 11/397,645

(22) Filed: Apr. 5, 2006

(65) Prior Publication Data

US 2006/0211296 A1    Sep. 21, 2006

Related U.S. Application Data

(62) Division of application No. 11/082,974, filed on Mar. 18, 2005, now Pat. No. 7,383,632.

(60) Provisional application No. 60/554,814, filed on Mar. 19, 2004.

(51) Int. Cl.
 *H01R 12/00* (2006.01)
 *H05K 1/00* (2006.01)
(52) U.S. Cl. .......................... 439/82; 439/66
(58) Field of Classification Search ............. 439/66, 439/60, 74, 82
 See application file for complete search history.

(56) References Cited

U.S. PATENT DOCUMENTS 3,543,587 A   12/1970   Kawada 3,634,807 A   1/1972   Grobe et al.
3,670,409 A   6/1972   Reimer (Continued)

FOREIGN PATENT DOCUMENTS

EP   0692823 A1   1/1996

(Continued)

OTHER PUBLICATIONS

An article entitled "Patented Socketing System for the BGA/CSP Technology", *E-tec Interconnect Ltd.*, 1-4 Pgs.

(Continued)

*Primary Examiner*—Chandrika Prasad

(57) ABSTRACT

An electrical connector made up of an array of metallic contacts that act as conductive carriers, each attached to a flexible insulating sheet in one of an array of openings provided in the flexible sheet. The metallic contacts have portions disposed on opposite sides of the flexible insulating sheet that form a contact channel region that retains a rim portion surrounding an opening. The electrical connector provides a flexible carrier for the contacts to conform to irregular mating surfaces of components to be joined. For a given contact height, the electrical connector further provides a minimum electrical path length for components connected by the contacts board. In one aspect, the metallic contacts including at least one side containing elastic portions are formed from sheets of conductive material. In one aspect, circular shaped contacts are singulated after opposing conductive sheets are joined in regions within the openings of the flexible insulating sheet.

5 Claims, 15 Drawing Sheets

U.S. PATENT DOCUMENTS

| | | | |
|---|---|---|---|
| 4,087,146 A | 5/1978 | Hudson, Jr. | |
| 4,175,810 A | 11/1979 | Holt et al. | |
| 4,548,451 A | 10/1985 | Benarr et al. | |
| 4,592,617 A | 6/1986 | Seidler | |
| 4,657,336 A | 4/1987 | Johnson et al. | |
| 4,734,053 A | 3/1988 | Imai | |
| 4,790,777 A | 12/1988 | Iimori et al. | |
| 4,893,172 A | 1/1990 | Matsumoto et al. | |
| 4,998,885 A | 3/1991 | Beaman | |
| 5,053,083 A | 10/1991 | Sinton | |
| 5,135,403 A | 8/1992 | Rinaldi | |
| 5,148,266 A | 9/1992 | Khandros et al. | |
| 5,152,695 A | 10/1992 | Grabbe et al. | |
| 5,161,983 A | 11/1992 | Ohno et al. | |
| 5,173,055 A | 12/1992 | Grabbe | |
| 5,199,879 A | 4/1993 | Kohn et al. | |
| 5,228,861 A | 7/1993 | Grabbe | |
| 5,257,950 A | 11/1993 | Lenker et al. | |
| 5,292,558 A | 3/1994 | Heller et al. | |
| 5,299,939 A | 4/1994 | Walker et al. | |
| 5,316,496 A | 5/1994 | Imai | |
| 5,338,209 A | 8/1994 | Brooks et al. | |
| 5,358,411 A | 10/1994 | Mroczkowski et al. | |
| 5,366,380 A | 11/1994 | Reymond | |
| 5,380,210 A | 1/1995 | Grabbe et al. | |
| 5,423,687 A | 6/1995 | Laub | |
| 5,468,655 A | 11/1995 | Greer | |
| 5,483,741 A | 1/1996 | Akram et al. | |
| 5,509,814 A | 4/1996 | Mosquera | |
| 5,528,456 A | 6/1996 | Takahashi | |
| 5,529,504 A * | 6/1996 | Greenstein et al. | 439/91 |
| 5,530,288 A | 6/1996 | Stone | |
| 5,532,612 A | 7/1996 | Liang | |
| 5,562,487 A | 10/1996 | Ii et al. | |
| 5,575,662 A | 11/1996 | Yamamoto et al. | |
| 5,590,460 A | 1/1997 | DiStefano et al. | |
| 5,593,903 A | 1/1997 | Beckenbaugh et al. | |
| 5,629,837 A | 5/1997 | Barabi et al. | |
| 5,632,631 A | 5/1997 | Fjelstad et al. | |
| 5,634,821 A | 6/1997 | Crane | |
| 5,691,913 A | 11/1997 | Tsuchida et al. | |
| 5,751,556 A | 5/1998 | Butler et al. | |
| 5,759,047 A * | 6/1998 | Brodsky et al. | 439/66 |
| 5,772,451 A | 6/1998 | Dozier, II et al. | |
| 5,791,911 A | 8/1998 | Fasano et al. | |
| 5,802,699 A | 9/1998 | Fjelstad et al. | |
| 5,812,378 A | 9/1998 | Fjelstad et al. | |
| 5,842,273 A | 12/1998 | Schar | |
| 5,860,585 A | 1/1999 | Rutledge et al. | |
| 5,896,038 A | 4/1999 | Budnaitis et al. | |
| 5,903,059 A | 5/1999 | Bertin et al. | |
| 5,906,498 A | 5/1999 | Nagafuji | |
| 5,911,597 A | 6/1999 | Oshitani | |
| 5,934,914 A | 8/1999 | Fjelstad et al. | |
| 5,938,453 A | 8/1999 | Ichimura | |
| 5,956,575 A | 9/1999 | Bertin et al. | |
| 5,967,797 A | 10/1999 | Maldonado | |
| 5,967,850 A | 10/1999 | Crane | |
| 5,980,335 A | 11/1999 | Barbieri et al. | |
| 5,981,870 A | 11/1999 | Barcley et al. | |
| 5,984,704 A | 11/1999 | Hashiguchi | |
| 5,989,994 A | 11/1999 | Khoury et al. | |
| 5,993,247 A | 11/1999 | Kidd | |
| 6,000,280 A | 12/1999 | Miller et al. | |
| 6,019,611 A | 2/2000 | McHugh et al. | |
| 6,027,366 A | 2/2000 | Mori et al. | |
| 6,029,344 A | 2/2000 | Khandros et al. | |
| 6,031,282 A | 2/2000 | Jones et al. | |
| 6,032,356 A | 3/2000 | Eldridge et al. | |
| 6,042,387 A | 3/2000 | Jonaidi | |
| 6,044,548 A | 4/2000 | Distefano et al. | |
| 6,056,572 A | 5/2000 | Matsumoto et al. | |
| 6,063,640 A | 5/2000 | Mizukoshi et al. | |
| 6,072,323 A | 6/2000 | Hembree et al. | |
| 6,083,837 A | 7/2000 | Millet | |
| 6,084,312 A | 7/2000 | Lee | |
| 6,089,904 A | 7/2000 | Wu | |
| 6,133,534 A | 10/2000 | Fukutomi et al. | |
| 6,142,789 A | 11/2000 | Nolan et al. | |
| 6,146,151 A | 11/2000 | Li | |
| 6,156,484 A | 12/2000 | Bassous et al. | |
| 6,181,144 B1 | 1/2001 | Hembree et al. | |
| 6,184,699 B1 | 2/2001 | Smith et al. | |
| 6,191,368 B1 | 2/2001 | Di Stefano et al. | |
| 6,196,852 B1 | 3/2001 | Neumann et al. | |
| 6,200,143 B1 | 3/2001 | Haba et al. | |
| 6,203,347 B1 | 3/2001 | Crane | |
| 6,204,065 B1 | 3/2001 | Ochiai | |
| 6,205,660 B1 | 3/2001 | Fjelstad et al. | |
| 6,208,157 B1 | 3/2001 | Akram et al. | |
| 6,218,848 B1 | 4/2001 | Hembree et al. | |
| 6,220,869 B1 | 4/2001 | Grant et al. | |
| 6,221,750 B1 | 4/2001 | Fjelstad | |
| 6,224,392 B1 | 5/2001 | Fasano et al. | |
| 6,250,933 B1 | 6/2001 | Khoury et al. | |
| 6,255,727 B1 | 7/2001 | Khoury | |
| 6,255,736 B1 | 7/2001 | Kaneko | |
| 6,263,566 B1 | 7/2001 | Hembree et al. | |
| 6,264,477 B1 | 7/2001 | Smith et al. | |
| 6,293,806 B1 | 9/2001 | Yu | |
| 6,293,808 B1 | 9/2001 | Ochiai | |
| 6,297,164 B1 | 10/2001 | Khoury et al. | |
| 6,298,552 B1 | 10/2001 | Li | |
| 6,300,782 B1 | 10/2001 | Hembree et al. | |
| 6,306,752 B1 | 10/2001 | DiStefano et al. | |
| 6,315,616 B1 | 11/2001 | Hayashi | |
| 6,332,801 B1 | 12/2001 | Watanbe | |
| 6,335,210 B1 | 1/2002 | Farooq et al. | |
| 6,336,269 B1 | 1/2002 | Eldridge et al. | |
| 6,337,575 B1 | 1/2002 | Akram | |
| 6,345,987 B1 | 2/2002 | Mori et al. | |
| 6,352,436 B1 | 3/2002 | Howard | |
| 6,361,328 B1 | 3/2002 | Gosselin | |
| 6,373,267 B1 | 4/2002 | Hiroi | |
| 6,374,487 B1 * | 4/2002 | Haba et al. | 29/840 |
| 6,375,474 B1 | 4/2002 | Harper, Jr. et al. | |
| 6,384,475 B1 | 5/2002 | Beroz et al. | |
| 6,392,524 B1 | 5/2002 | Biegelsen et al. | |
| 6,392,534 B1 | 5/2002 | Flick | |
| 6,397,460 B1 | 6/2002 | Hembree et al. | |
| 6,399,900 B1 | 6/2002 | Khoury et al. | |
| 6,402,526 B1 | 6/2002 | Schreiber et al. | |
| 6,409,521 B1 | 6/2002 | Rathburn | |
| 6,420,661 B1 | 7/2002 | Di Stefano et al. | |
| 6,420,789 B1 | 7/2002 | Tay et al. | |
| 6,420,884 B1 | 7/2002 | Khoury et al. | |
| 6,428,328 B2 | 8/2002 | Haba et al. | |
| 6,431,881 B1 | 8/2002 | Engbring et al. | |
| 6,436,802 B1 | 8/2002 | Khoury | |
| 6,437,591 B1 | 8/2002 | Farnworth et al. | |
| 6,442,039 B1 * | 8/2002 | Schreiber | 361/760 |
| 6,447,305 B1 | 9/2002 | Roberts | |
| 6,452,407 B2 | 9/2002 | Khoury et al. | |
| 6,454,573 B2 | 9/2002 | Hayashi et al. | |
| 6,461,892 B2 | 10/2002 | Beroz | |
| 6,465,748 B2 | 10/2002 | Yamanashi et al. | |
| 6,472,890 B2 | 10/2002 | Khoury et al. | |
| 6,474,997 B1 | 11/2002 | Ochiai | |
| 6,492,251 B1 | 12/2002 | Haba et al. | |
| 6,497,581 B2 | 12/2002 | Slocum et al. | |
| 6,517,362 B2 | 2/2003 | Hirai et al. | |
| 6,520,778 B1 | 2/2003 | Eldridge et al. | |
| 6,524,115 B1 | 2/2003 | Gates et al. | |
| 6,551,112 B1 | 4/2003 | Li et al. | |

| | | |
|---|---|---|
| 6,558,187 B2 | 5/2003 | Aoki |
| 6,576,485 B2 | 6/2003 | Zhou et al. |
| 6,577,003 B1 | 6/2003 | Crane et al. |
| 6,604,950 B2 | 8/2003 | Maldonado et al. |
| 6,612,861 B2 | 9/2003 | Khoury et al. |
| 6,616,966 B2 | 9/2003 | Mathieu et al. |
| 6,622,380 B1 | 9/2003 | Grigg |
| 6,627,092 B2 | 9/2003 | Clements et al. |
| 6,640,432 B1 | 11/2003 | Mathieu et al. |
| 6,661,247 B2 | 12/2003 | Maruyama et al. |
| 6,663,399 B2 | 12/2003 | Ali et al. |
| 6,664,131 B2 | 12/2003 | Jackson |
| 6,669,489 B1 | 12/2003 | Dozier, II et al. |
| 6,671,947 B2 | 1/2004 | Bohr |
| 6,672,879 B2 | 1/2004 | Neidich et al. |
| 6,677,245 B2 | 1/2004 | Zhou et al. |
| 6,692,263 B2 | 2/2004 | Villain et al. |
| 6,692,265 B2 | 2/2004 | Kung et al. |
| 6,700,072 B2 | 3/2004 | Distefano et al. |
| 6,701,612 B2 | 3/2004 | Khandros et al. |
| 6,719,569 B2 | 4/2004 | Ochiai |
| 6,730,134 B2 | 5/2004 | Neidich |
| 6,733,326 B2 | 5/2004 | Lee |
| 6,736,664 B2 | 5/2004 | Ueda et al. |
| 6,736,665 B2 | 5/2004 | Zhou et al. |
| 6,749,459 B2 | 6/2004 | Urbaniak et al. |
| 6,750,136 B2 | 6/2004 | Zhou et al. |
| 6,750,551 B1 | 6/2004 | Frutschy et al. |
| 6,763,581 B2 | 7/2004 | Hirai et al. |
| 6,791,171 B2 | 9/2004 | Mok et al. |
| 6,814,584 B2 | 11/2004 | Zaderej |
| 6,814,587 B2 | 11/2004 | Ma |
| 6,815,961 B2 | 11/2004 | Mok et al. |
| 6,821,129 B2 | 11/2004 | Tsuchiya |
| 6,843,659 B2 | 1/2005 | Liao et al. |
| 6,847,101 B2 | 1/2005 | Fjelstad et al. |
| 6,848,173 B2 | 2/2005 | Fjelstad et al. |
| 6,848,929 B2 | 2/2005 | Ma |
| 6,853,210 B1 | 2/2005 | Farnworth et al. |
| 6,857,880 B2 | 2/2005 | Ohtsuki et al. |
| 6,869,290 B2 | 3/2005 | Brown et al. |
| 6,869,307 B2 | 3/2005 | Endo |
| 6,881,070 B2 | 4/2005 | Chiang |
| 6,887,085 B2 | 5/2005 | Hirai |
| 6,898,580 B1 | 5/2005 | Curran et al. |
| 6,898,773 B1 | 5/2005 | Teig et al. |
| 6,902,425 B2 | 6/2005 | Huang |
| 6,916,181 B2 * | 7/2005 | Brown et al. .................. 439/66 |
| 6,920,689 B2 | 7/2005 | Khandros et al. |
| 6,923,656 B2 | 8/2005 | Novotny et al. |
| 6,926,536 B2 | 8/2005 | Ochiai |
| 6,939,143 B2 | 9/2005 | Rathburn |
| 6,957,963 B2 * | 10/2005 | Rathburn .................. 439/66 |
| 6,960,924 B2 | 11/2005 | Akram |
| 6,976,888 B2 | 12/2005 | Shirai et al. |
| 6,980,017 B1 | 12/2005 | Farnworth et al. |
| 6,995,557 B2 | 2/2006 | Goldfine et al. |
| 6,995,577 B2 | 2/2006 | Farnworth et al. |
| 7,001,208 B2 | 2/2006 | Huang |
| 7,002,362 B2 | 2/2006 | Farnworth et al. |
| 7,004,775 B1 | 2/2006 | Sakurai et al. |
| 7,009,413 B1 | 3/2006 | Alghouli |
| 7,021,941 B1 | 4/2006 | Chuang et al. |
| 7,021,970 B2 | 4/2006 | Ozai |
| 7,025,601 B2 | 4/2006 | Dittmann |
| D521,455 S | 5/2006 | Radza |
| D521,940 S | 5/2006 | Radza |
| 7,048,548 B2 | 5/2006 | Mathieu et al. |
| 7,053,482 B2 | 5/2006 | Cho |
| D522,461 S | 6/2006 | Radza |
| D522,972 S | 6/2006 | Long et al. |
| 7,056,131 B1 * | 6/2006 | Williams .................. 439/74 |
| 7,063,560 B2 | 6/2006 | Asao |
| D524,756 S | 7/2006 | Radza |
| 7,070,419 B2 | 7/2006 | Brown et al. |
| 7,074,074 B2 | 7/2006 | Zhang et al. |
| 7,083,425 B2 | 8/2006 | Chong et al. |
| 7,086,869 B1 | 8/2006 | Dangler et al. |
| 7,090,503 B2 | 8/2006 | Dittmann |
| 7,097,496 B2 | 8/2006 | Zhang et al. |
| 7,112,089 B1 | 9/2006 | Liu et al. |
| 7,113,408 B2 | 9/2006 | Brown et al. |
| 7,114,961 B2 * | 10/2006 | Williams .................. 439/66 |
| 7,140,883 B2 | 11/2006 | Khandros et al. |
| 7,189,090 B2 | 3/2007 | Aizawa et al. |
| 7,210,942 B2 | 5/2007 | Uchida et |
| 7,238,044 B2 | 7/2007 | Uchida et al. |
| 7,244,125 B2 | 7/2007 | Brown et al. |
| 7,252,540 B2 | 8/2007 | Tanaka |
| 7,261,569 B2 | 8/2007 | Uchida et al. |
| 7,261,595 B2 | 8/2007 | Shino |
| 7,263,771 B2 | 9/2007 | Ochiai |
| 7,285,015 B2 | 10/2007 | Helbok et al. |
| 7,383,632 B2 | 6/2008 | Dittmann |
| 2001/0001080 A1 | 5/2001 | Eldridge et al. |
| 2001/0024890 A1 | 9/2001 | Maruyama et al. |
| 2002/0006744 A1 | 1/2002 | Tashiro |
| 2002/0008966 A1 | 1/2002 | Fjelstad et al. |
| 2002/0011859 A1 | 1/2002 | Smith et al. |
| 2002/0055282 A1 | 5/2002 | Eldridge et al. |
| 2002/0055289 A1 | 5/2002 | Murakami et al. |
| 2002/0058356 A1 | 5/2002 | Oya |
| 2002/0079120 A1 | 6/2002 | Eskildsen et al. |
| 2002/0117330 A1 | 8/2002 | Eldridge et al. |
| 2002/0129866 A1 | 9/2002 | Czebatul et al. |
| 2002/0129894 A1 | 9/2002 | Liu et al. |
| 2002/0133941 A1 | 9/2002 | Akram et al. |
| 2002/0146919 A1 | 10/2002 | Cohn |
| 2002/0178331 A1 | 11/2002 | Beardsley et al. |
| 2003/0000739 A1 | 1/2003 | Frutschy et al. |
| 2003/0003779 A1 | 1/2003 | Rathburn |
| 2003/0022503 A1 | 1/2003 | Clements et al. |
| 2003/0035277 A1 | 2/2003 | Saputro et al. |
| 2003/0049951 A1 | 3/2003 | Eldridge et al. |
| 2003/0064635 A1 | 4/2003 | Ochiai |
| 2003/0089936 A1 | 5/2003 | McCormack et al. |
| 2003/0092293 A1 | 5/2003 | Ohtsuki et al. |
| 2003/0096512 A1 | 5/2003 | Cornell |
| 2003/0099097 A1 | 5/2003 | Mok et al. |
| 2003/0129866 A1 | 7/2003 | Romano et al. |
| 2003/0147197 A1 | 8/2003 | Uriu et al. |
| 2003/0194832 A1 | 10/2003 | Lopata et al. |
| 2004/0029411 A1 | 2/2004 | Rathburn |
| 2004/0033717 A1 | 2/2004 | Peng |
| 2004/0072467 A1 | 4/2004 | Jordan et al. |
| 2004/0118603 A1 | 6/2004 | Chambers |
| 2004/0127073 A1 | 7/2004 | Ochiai |
| 2005/0088193 A1 | 4/2005 | Haga |
| 2005/0099193 A1 | 5/2005 | Burgess |
| 2005/0142900 A1 | 6/2005 | Boggs et al. |
| 2005/0167816 A1 | 8/2005 | Khandros et al. |
| 2005/0208788 A1 | 9/2005 | Dittmann |
| 2005/0287828 A1 | 12/2005 | Stone et al. |
| 2006/0028222 A1 | 2/2006 | Farnworth et al. |
| 2007/0054544 A1 | 3/2007 | Hirata |
| 2007/0054545 A1 | 3/2007 | Takahira |
| 2007/0105433 A1 | 5/2007 | Shioda et al. |
| 2007/0123074 A1 | 5/2007 | Nishimura |
| 2007/0178751 A1 | 8/2007 | Yamamoto |
| 2007/0275579 A1 | 11/2007 | Si et al. |
| 2008/0045076 A1 | 2/2008 | Dittmann et al. |
| 2008/0050958 A1 | 2/2008 | Hashiguchi et al. |

| | | | |
|---|---|---|---|
| 2008/0076282 A1 | 3/2008 | Yamaji et al. | |

FOREIGN PATENT DOCUMENTS

| | | |
|---|---|---|
| EP | 1005086 A2 | 5/2000 |
| EP | 1280241 A1 | 1/2003 |
| EP | 0839321 B1 | 1/2006 |
| JP | 2000-114433 | 4/2000 |
| JP | 2001-203435 | 7/2001 |
| WO | WO-9602068 A1 | 1/1996 |
| WO | WO-9743653 A1 | 11/1997 |
| WO | WO-9744859 A1 | 11/1997 |
| WO | WO-0213253 A1 | 2/2002 |
| WO | WO-2005034296 A1 | 4/2005 |
| WO | WO-2005036940 A1 | 4/2005 |
| WO | WO-2005067361 A1 | 7/2005 |

OTHER PUBLICATIONS

Mahajan, Ravi, et al., "Emerging Directions for packaging Technologies", *Intel Technology Journal*, V. 6, Issue 02, (May 16, 2002),62-75 pgs.

Williams, John D., "Contact Grid Array System", *Patented Socketing System for the BGA/CSP Technology*, E-tec Interconnect Ltd.,(Jun. 2006),1-4 pgs.

* cited by examiner

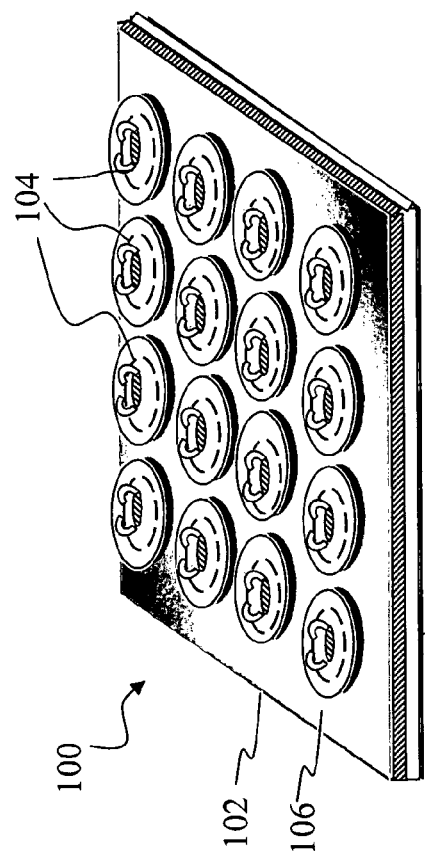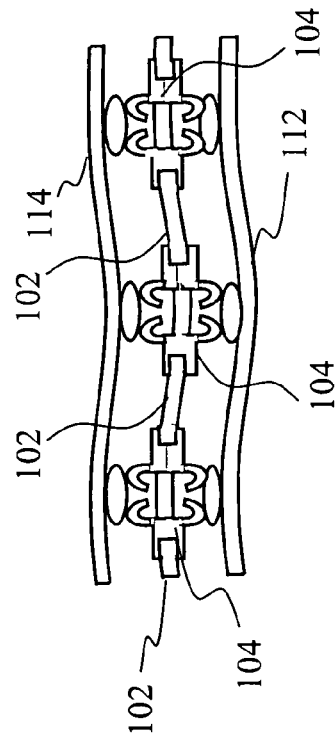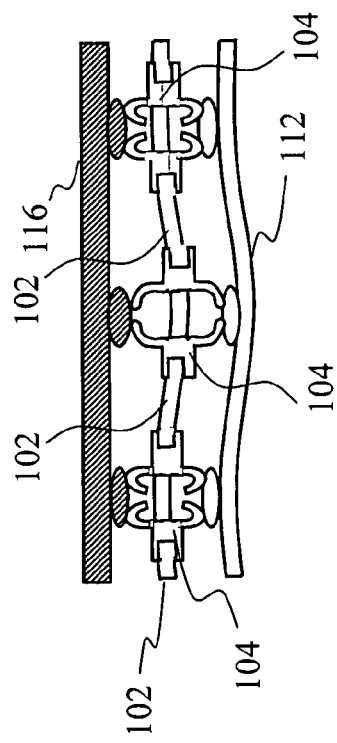

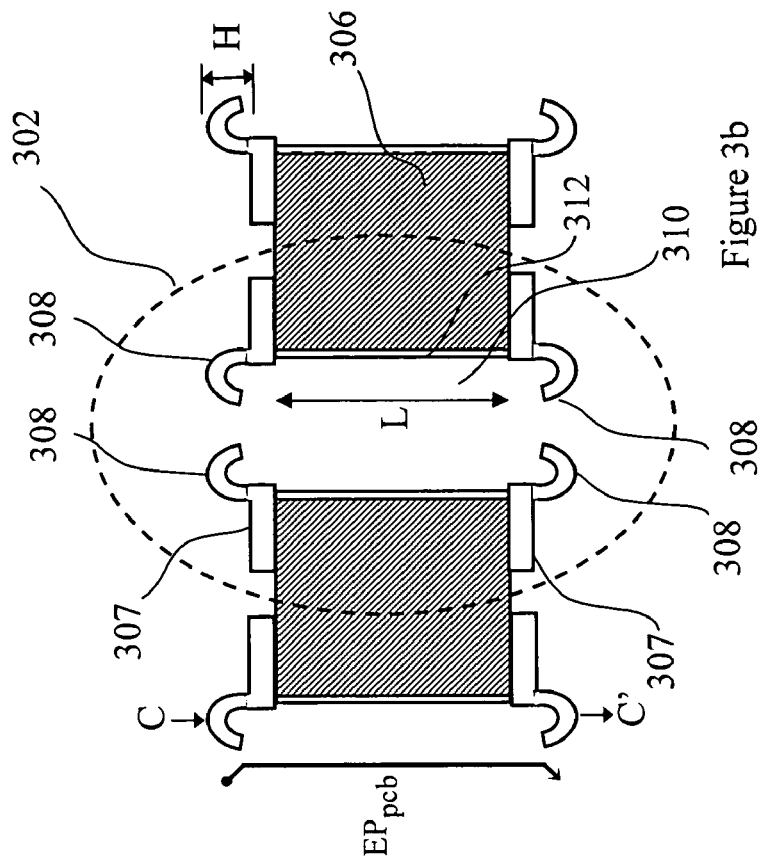
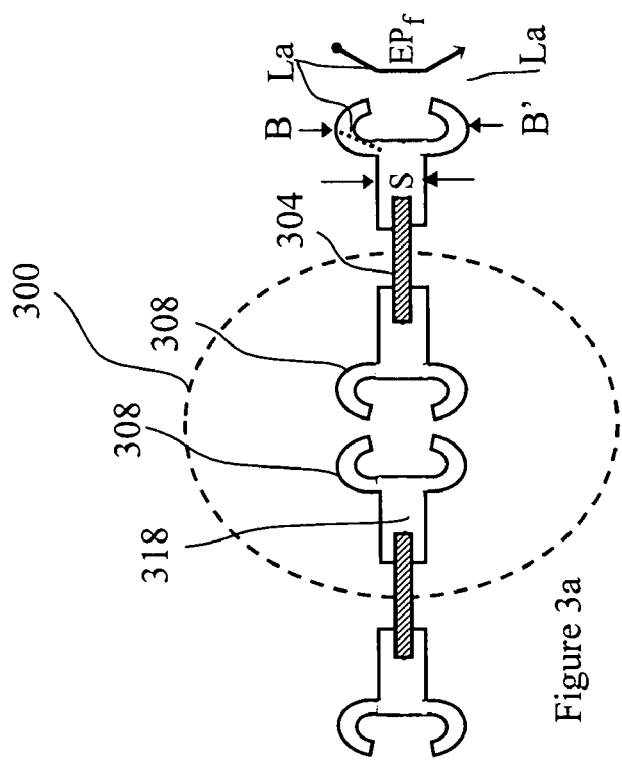
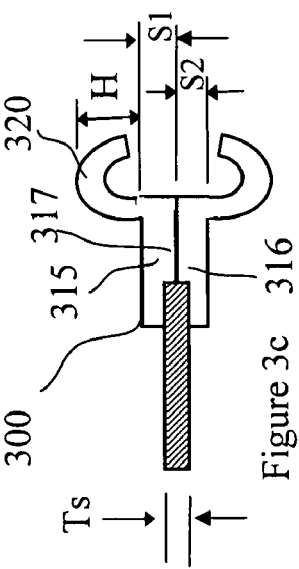
Figure 3a
Figure 3b
Figure 3c

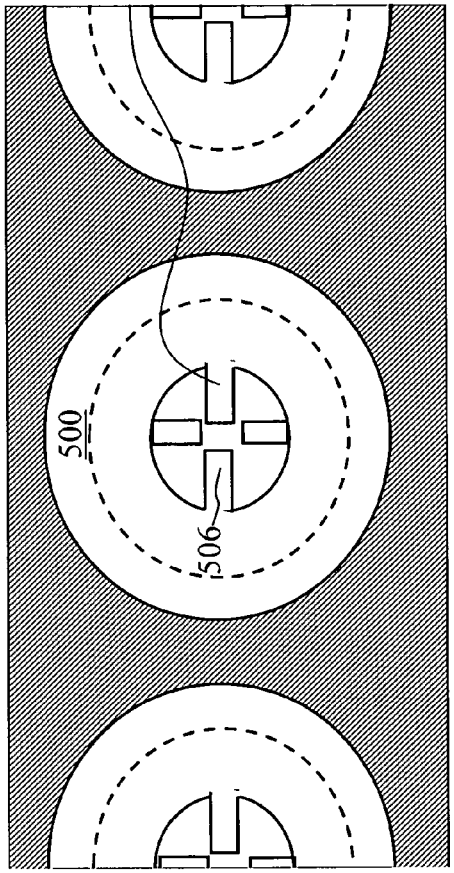
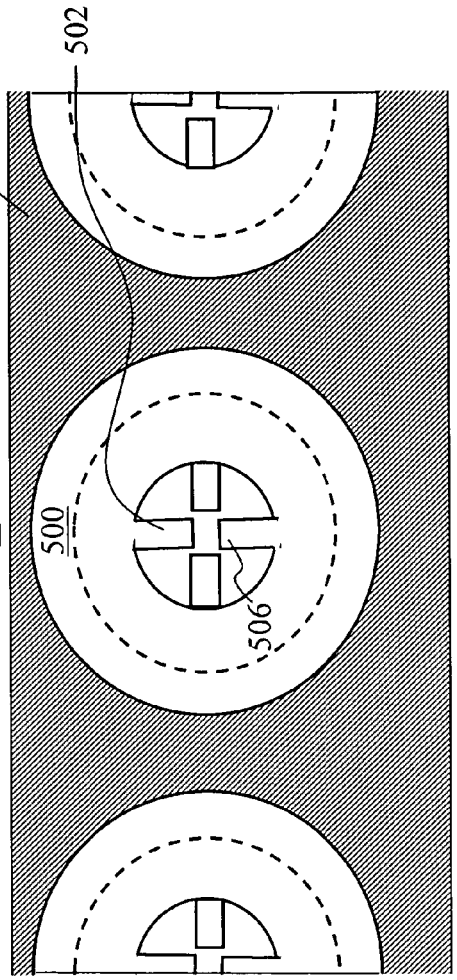
Figure 5a
Figure 5b
Figure 5c

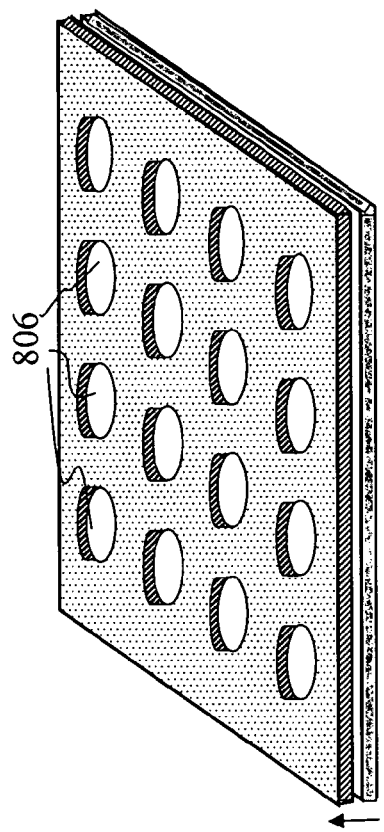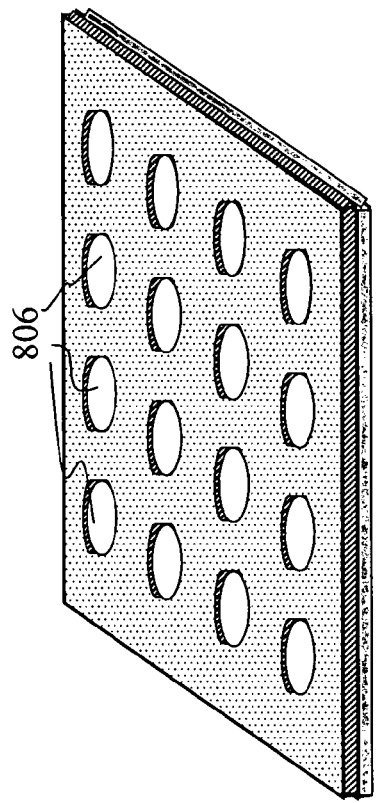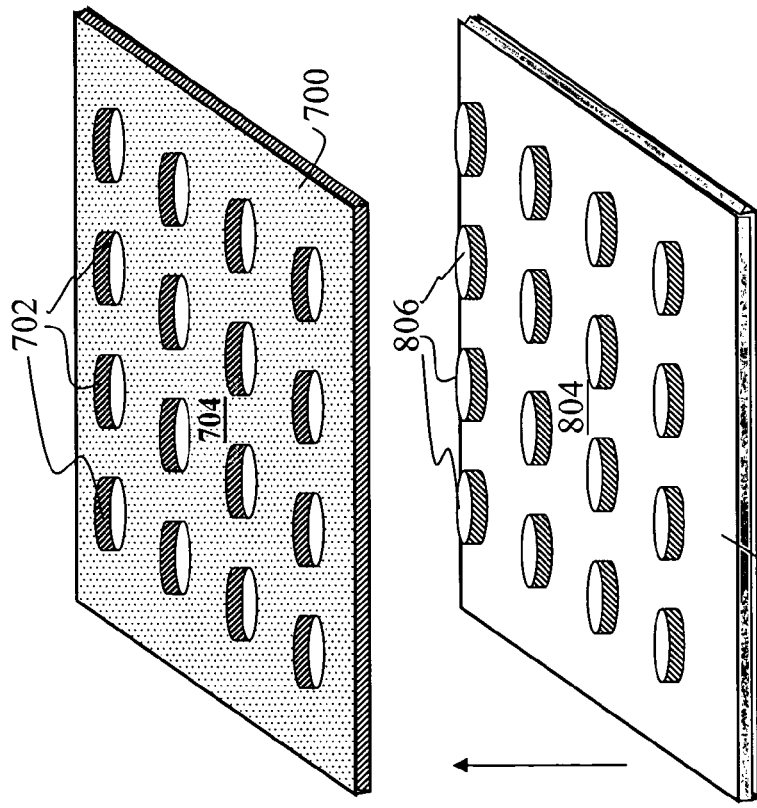

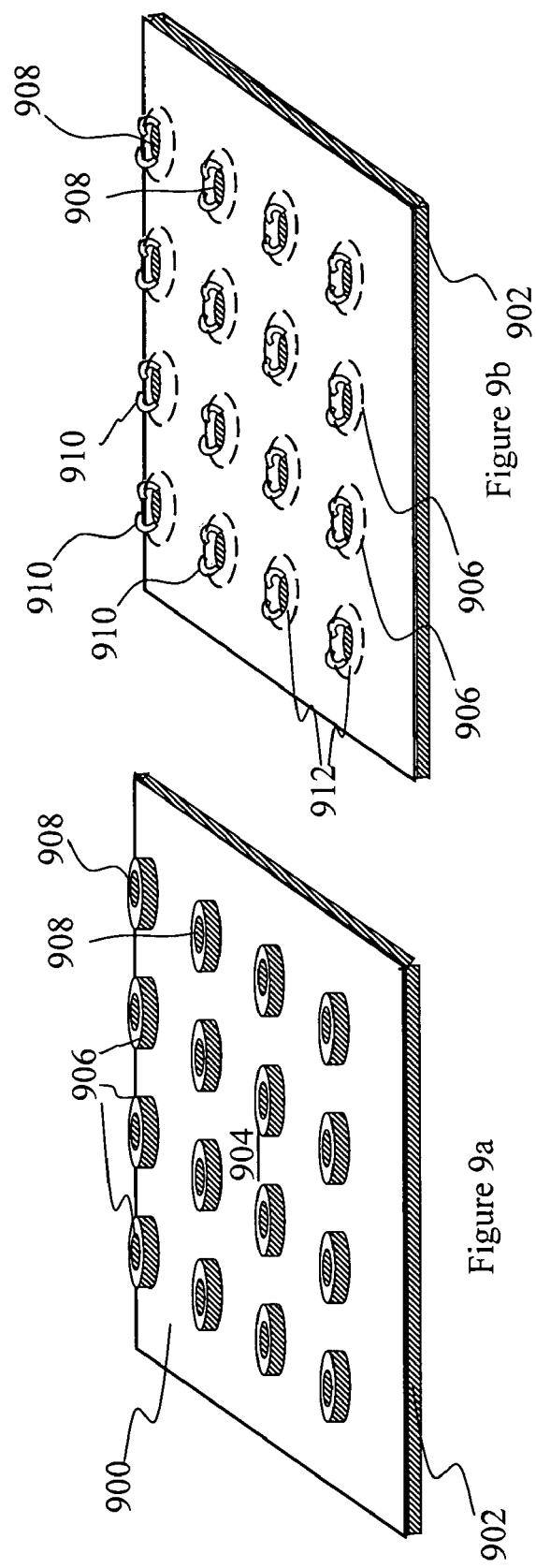

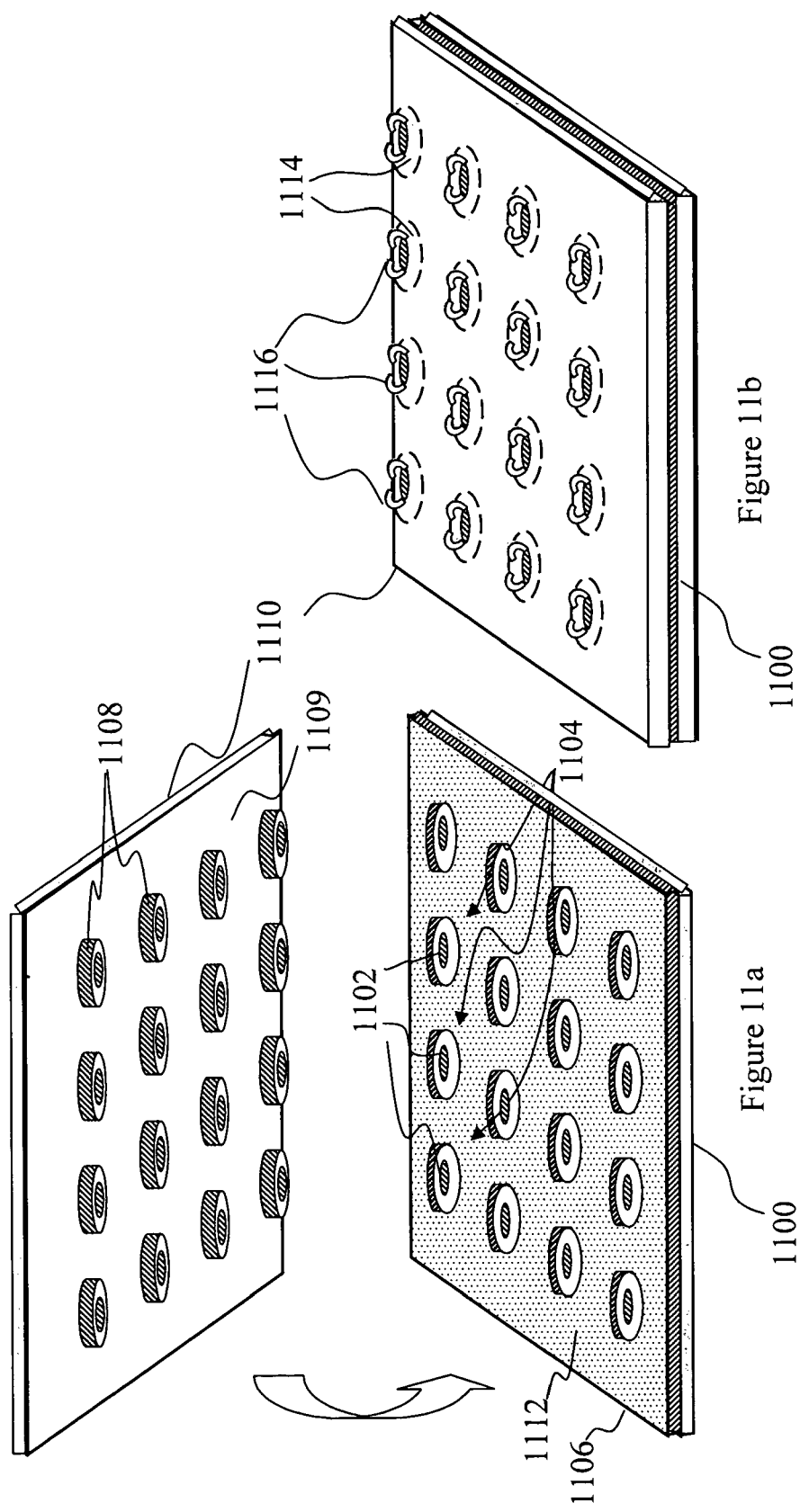

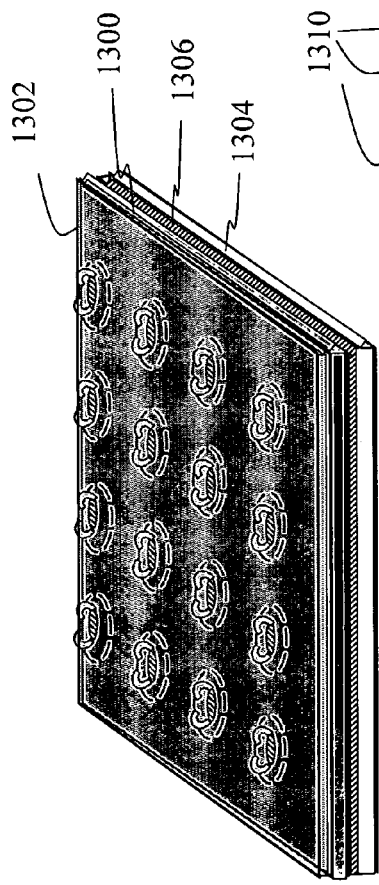
Figure 13a
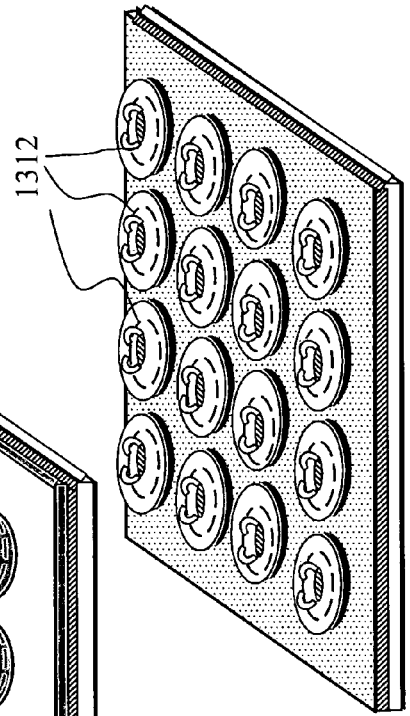
Figure 13b
Figure 13c

ELECTRICAL CONNECTOR HAVING A FLEXIBLE SHEET AND ONE OR MORE CONDUCTIVE CONNECTORS

This application is a division of U.S. patent application Ser. No. 11/082,974, filed Mar. 18, 2005, now U.S. Pat. No. 7,383,632.

This application claims the benefit of U.S. Provisional Application No. 60/554,814 filed Mar. 19, 2004, which is herein incorporated by reference in its entirety.

BACKGROUND

1. Field of the Invention

The present invention relates to forming electrical connectors in an insulating host, and more particularly, to forming arrays of spring elements in a flexible polymer sheet.

2. Background of the Invention

Conventional electrical connectors used to connect components such as printed circuit boards are fabricated using a wide variety of techniques. A common approach is to use stamped metal springs, which are formed and then individually inserted into an insulating carrier to form an array of electrical connection elements. Other approaches to making electrical connectors include using anisotropically conductive adhesives, injection molded conductive adhesives, bundled wire conductive elements, and small solid pieces of metal.

As the desire for device performance enhancement drives packaging technology to shrink the spacing (or the pitch) between electrical connections (also referred to as a "leads"), a need exists to shrink the size of individual connector elements. At the same time, the total number of connections per package is increasing. For example, existing integrated circuit (IC) packages may be built with a pitch of 1 mm or less with 600 or more connections. Furthermore, IC devices are designed to be operated at increasingly higher frequencies. For example, IC devices for use in computing, telecommunication, and networking applications can be operated at a frequency of several GHz. Operating frequencies of the electronic devices, package size, and lead count of the device packages thus place stringent requirements on the interconnect systems used to test or connect these electronic devices.

In particular, the mechanical, electrical, and reliability performance criteria of an interconnect system are becoming increasingly demanding. Electrical and mechanical reliability specifications for use with high speed, small dimension and large pin count IC devices can place requirements that conventional interconnect technologies described above cannot easily fulfill. In general, conventional connector systems optimized for electrical performance have poor mechanical and reliability properties, while connector systems optimized for mechanical performance and improved reliability have poor electrical characteristics.

A particular problem encountered by today's interconnect systems is non-coplanarity of leads in the electronic components to be connected. Coplanarity of elements in a planar package exists, for example, when those elements reside within a common reference geometrical plane. In a conventional package, factors that can contribute to non-coplanarity of connector elements (or leads) of the package include manufacturing variability and substrate warpage. For conventional connector elements arranged in an array, coplanarity variation across a package may exceed vertical tolerances for connector elements, resulting in failure of electrical connection in some elements.

Coplanarity problems are not limited to IC packages, they may also exist in a printed circuit board (PC board) to which these IC packages are attached. Coplanarity problems may exist for land grid array pads formed as an area array on a PC board due to warpage of the PC board substrate. Typically, deviation from flatness in a conventional PC board is on the order of 75 to 125 microns or more per inch.

Additionally, the deviations from planarity in circuit boards, packages, and other components in which arrays of electrical connectors are employed, often may not scale down as other dimensions, such as array spacing and connector size, decrease. Thus, for example, large vertical deviations in positions of contacts may occur even for circuit boards or other components that have smaller pitch. For conventional connectors having pitch of less than about 2 mm between connector contacts, it becomes more difficult as the pitch decreases to produce elastic contacts that can compensate for such coplanarity deviations and still realize acceptable electrical contact properties, such as low resistance and low inductance.

DESCRIPTION OF THE DRAWINGS

FIG. 1a is a perspective view of an electrical connector formed on a flexible sheet, according to one configuration of the invention.

FIG. 1b is a cross-sectional view of an electrical connector, illustrating the electrical coupling of two components, according to one implementation of the invention.

FIG. 1c is a cross-sectional view of an electrical connector, illustrating the electrical coupling of two components, according to another implementation of the invention.

FIGS. 3a and 3b illustrate an integrated contact formed according to an exemplary configuration of this invention, and an electrical connector element formed on a conventional insulating substrate, respectively.

FIG. 3c illustrates details of an integrated contact according to one configuration of the invention.

FIGS. 5a-5c illustrate a top view, cross-sectional view, and bottom view of an electrical contact arranged according to another configuration of the invention.

FIGS. 8a-8c illustrate an exemplary registration of a conductive sheet with an array of openings.

FIGS. 9a and 9b illustrate a top and bottom perspective view of an exemplary variation of a conductive sheet, according to one configuration of the invention.

FIGS. 11a and 11b illustrates registration of a conductive sheet with an insulating sheet already registered with another conductive sheet, according to one configuration of the invention.

FIGS. 13a-13c illustrate singulation of contacts according to one aspect of the invention.

DETAILED DESCRIPTION

Figure 2B:
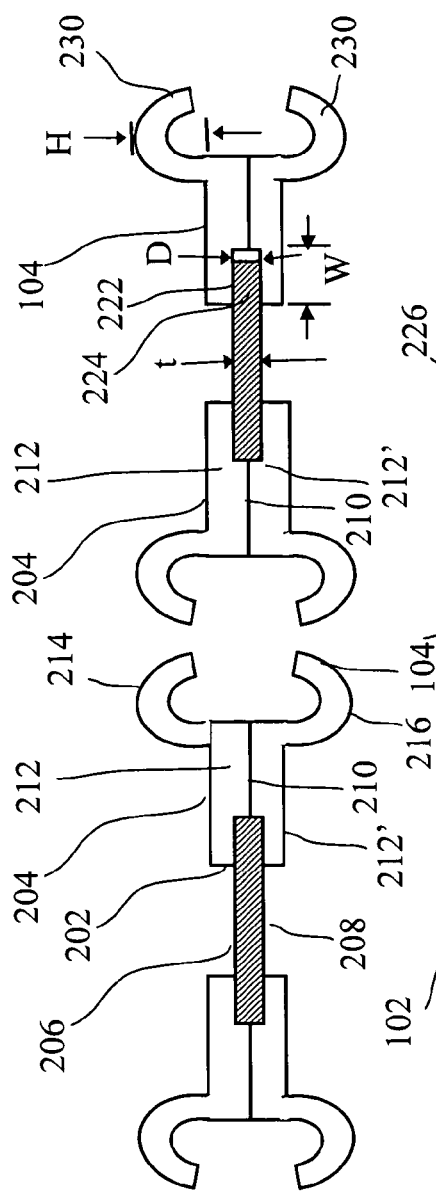
FIGS. 2a and 2b illustrate a plan view and cross-sectional view of an individual contact, according to one configuration of the present invention.

FIG. 1 illustrates an electrical connector 100 arranged according to one configuration of the invention. Connector 100 includes a flexible insulating sheet 102 that retains an array of electrical contacts 104. Electrical contacts 104 are electrically isolated from each other by insulating sheet 102. Connector 100 can be used to electrically connect device components, printed circuit boards, and other electrical packaging components. Thus, each of electrical contacts 104 can serve as a conductive connector that electrically connects a component disposed on surface 106 to one disposed on opposite surface 108.

In one configuration, insulating sheet 102 is comprised of a polymer material, such as a polyester, so that insulating sheet 102 retains good electrical insulating properties. Insulating sheet 102 is sufficiently thin that it imparts a flexibility to connector 100. For example, insulating sheet 102 can have a thickness of about 5 mils or less. Although connector 100 can assume an overall flat, planar configuration when resting on a flat planar surface, the flexibility of insulating sheet 102 allows for surface 106 to conform to non-planar or uneven surfaces such that electrical contacts 104 in one region of connector 100 can lie in a plane above or below that of electrical connectors in another region of connector 100. Accordingly, electrical components or devices presenting variations in height of electrical contact features due to thickness non-uniformity or other features, can be more easily joined to other components using connector 100, than is the case using a mechanically stiff connector.

FIG. 1b is a cross-sectional view of electrical connector 100, illustrating the electrical coupling of two components, 112 and 114, respectively, according to one implementation of the invention. Flexible insulating sheet 102 assumes a shape that conforms to the shape of uneven components 112 and 114, helping facilitate coupling of the two uneven components. Additionally, as illustrated in FIG. 1c, contacts 104 can elastically deform to a greater or lesser degree to accommodate for different distances between flexible insulating sheet 102 and component 116, while still maintaining contact to uneven component 112.

Figure 2A:
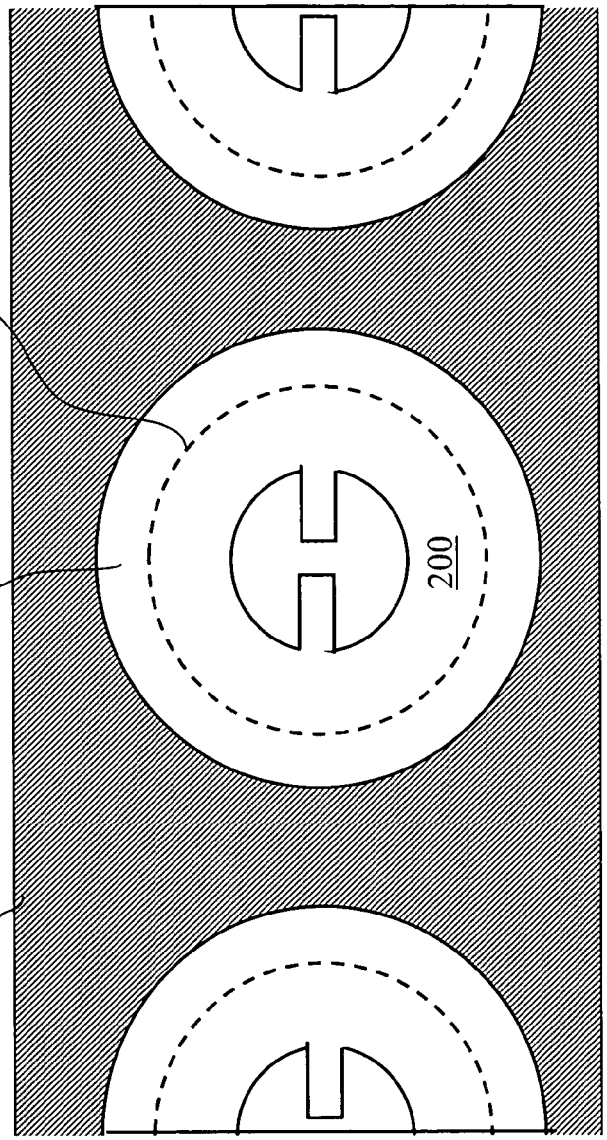

FIGS. 2a and 2b illustrate a plan view and cross-sectional view of an individual contact 104 of connector 100, according to one configuration of the present invention. Contact 104 is a metallic material such as a copper alloy, metal-coated titanium, or gold alloy coated stainless steel. Contact 104 includes a base portion 202 that has flat outer surfaces 204. As depicted in FIG. 2b, base portion 202 extends from a top side 206 of insulating sheet 102 to bottom side 208. In the example shown in FIG. 2b, base portion 202 can include conductive layer 210, which lies between top base portion 212 and bottom base portion 212', as described in more detail below. Base portion 202 provides a continuous electrically conductive path for current traveling through contact 104 from top region 214 to bottom region 216.

Contact 104 also includes a recess (also referred to as "channel") 222 that receives a rim portion 224 of flexible insulating sheet 102. Channel 222 serves to anchor contact 104 to flexible insulating sheet 102. In the configuration illustrated in FIGS. 2a and 2b, channel 222 is a substantially circular channel that lies along the periphery of contact 104 and mates to a circular hole 226 in sheet 102. In this configuration, the channel thickness D is about the same as the thickness t of flexible insulating sheet 102, so that rim portions 224 fit snugly within channel 222. In other configurations, D can be greater than or less than t. The width W of channel 222 can be varied, but is designed to ensure that at least some of rim portion 224 is retained within channel 222.

Contact 104 includes spring elements 230 that rise from base portion 202 and extend above surface 204 to a height H. In the example shown, the spring elements comprise four arms, with two arms each disposed on opposite sides of insulating sheet 102. The spring elements on each side of insulating sheet 102 can deform over an elastic distance (ED) while maintaining good electrical contact with elements of a printed circuit board (PCB), device, or other electrical component. This configuration provides an additional mechanism to ensure electrical contact between the contacts 104 of connector 100 and another electrical component that varies in thickness. For example, when a PCB of non-uniform thickness is brought into contact with connector 100, certain contact sites of the PCB designed to couple with contacts 104 will establish contact first. Further displacement of the PCB can cause these contacts 104 to elastically deform while electrical contact is established at other sites. Accordingly, a larger value of ED can accommodate larger variations in thickness uniformity of a PCB to be contacted.

In the configuration illustrated in FIG. 2b, contact 104 can provide a minimum electrical path for connecting electrical components because contact 104 constitutes a single integrated electrical contact as described in more detail below.

FIGS. 3a and 3b illustrate a comparison of an integrated contact 300 formed according to an exemplary configuration of this invention, with an electrical connector element 302 formed on a conventional insulating substrate 306, respectively. Integrated contact 300 is anchored on a flexible insulating sheet 304 substantially similar to insulating sheet 102, as described above with respect to FIGS. 1, 2a, and 2b. Connector element 302 contains two contact portions 307 that have a shape substantially the same in plan view as contacts 104 of FIG. 2b. Contact portions 307 can be formed from conductive sheets that are patterned and laminated on opposite sides of insulating substrate 306. Contact portions 307 are spaced along via 310 by a distance L corresponding to the thickness of insulating substrate 306. For example, insulating substrate 306 can be a PCB having a typical thickness in the range of 20-250 mils. Connector elements 302 are electrically connected by a conductive lining 312, which is typically a plated metal coating. A total electrical path length $EP_{pcb}$ for current traveling across connector element 302 from points C to C' includes the distance L and contributions from the thickness of contact portions 307 and a distance along spring arm portions 308.

Contact 300, on the other hand, can provide a much smaller electrical path length $EP_f$. For purposes of comparison, it can be assumed that in one configuration, contact 300 is formed from bonded conductive sheets (described in detail below), where the height S of base region 318 is equivalent to the sum of thicknesses of conductive sheets that are used to form elements 307. Furthermore, spring portions 308 are assumed to be the same as those in connector 302. Accordingly, the difference in $EP_{pcb}$ and $EP_f$ corresponds to the thickness L of insulating substrate 306.

In one configuration, as illustrated in FIG. 3c, contact 300 can comprise contact portions 315 and 316 joined at conductive interface 317. Contact portions 315 and 316 each have an initial thickness, S1 and S2, respectively, corresponding to that of a conductive sheet from which the respective portion is formed, as discussed further below. As shown in FIGS. 3a and 3c, for a given a total thickness S=S1+S2 of conductive sheets that can be used to form base portion 318, and for an elastic portion current path La, where La defines the distance that current travels to or from an external component along the spring arm to the base, the configuration of contact 300 produces a minimum electrical path length $EP_f$. $EP_f$ represents the path that current travels when going from points B to B' that can be contact points to external components. Unlike the case of the connector in FIG. 3b, in this configuration, the thickness Ts of an insulating carrier, such as sheet 304 of contact 300, does not contribute to the electrical path length. This is because the thickness S of base portion 314, as illustrated in FIG. 3a, is designed to exceed Ts, so that a channel in base 318 can be formed to retain insulating sheet 304, as described above with respect to FIG. 2b. Thus, $EP_f$ equals only the sum of S and 2×La, and is not altered by changes in Ts. In exemplary configurations, S is about 1-8 mils. In contrast, L in conventional connectors is typically 20-250 mils or greater.

Figure 4B:
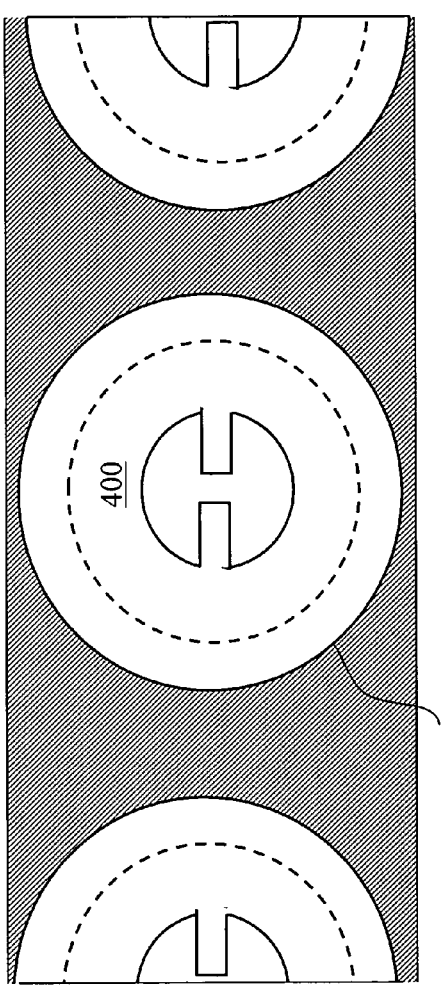
FIGS. 4a, 4b, and 4c illustrate a cross-sectional view, top view, and bottom view, respectively, of an electrical contact arranged according to another configuration of the invention.
Figure 4A:
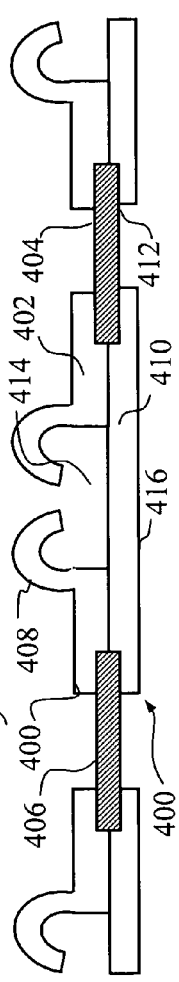
Figure 4C:
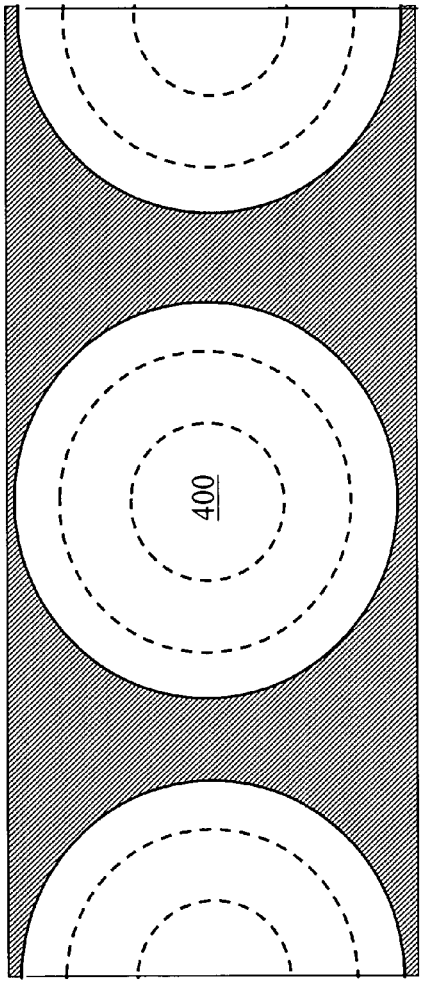

FIGS. 4a, 4b, and 4c illustrate a cross-sectional view, top view, and bottom view, respectively, of a contact 400, arranged according to another configuration of the invention. In this configuration, a first base portion 402 disposed on surface 404 of flexible insulating sheet 406, is coupled to an elastic portion 408 comprising two elastic arms. A second base portion 410 disposed on opposite surface 412 of insulating sheet 406 extends across via 414 and contains no attached elastic portions. Bottom surface 416 of contact 400 can be used, for example, to couple to a solder ball and form a permanent connection thereto.

In another configuration of the present invention illustrated in FIGS. 5a-5c, contact 500 is configured the same as contact 104 illustrated in FIGS. 2a and 2b, except that the position of sets of spring elements 502 disposed on opposite sides of insulating sheet 504 are rotated with respect to one another. This latter configuration can be employed to avoid collision of distal ends 506 of spring elements 502 on opposite sides of insulating sheet 504, when the spring elements are displaced towards each other, for example, when displaced towards point A.

In other configurations of the invention, within a given side of a flexible insulating sheet, the shape or configuration of elastic portions of contacts can be varied between contact positions within an array according to design. Thus, for example, some contact positions may include longer elastic arms, while other contact positions include shorter contact arms. Additionally, the height of contact arms can be varied among different contact positions within an array.

The exemplary connector of FIG. 1 has several distinguishing features. In the first instance, the connector can be mechanically deformed more than connectors formed in rigid insulating carriers such as conventional printed circuit boards. Another feature, as discussed above, is the ability to provide a minimal electrical path length between electrical components connected by the connector. Furthermore, contacts in the array of contacts of the connector can be spaced at a minimum distance between each other, so that connections to electrical components with a small contact spacing can be made. In the configurations shown in FIGS. 1-5c, contacts have a substantially circular shape within the plane of the flexible insulating sheet. In this manner, minimal electrical coupling is sustained between neighboring contacts, thus allowing contacts to be spaced closer together. Finally, as detailed further below, elastic portions of the contacts can be fabricated by lithographic techniques and forming, providing for a large range of mechanical deformation sustainable for a given contact. These features provide a unique profile of properties not attainable in conventional connectors.

Figure 6:
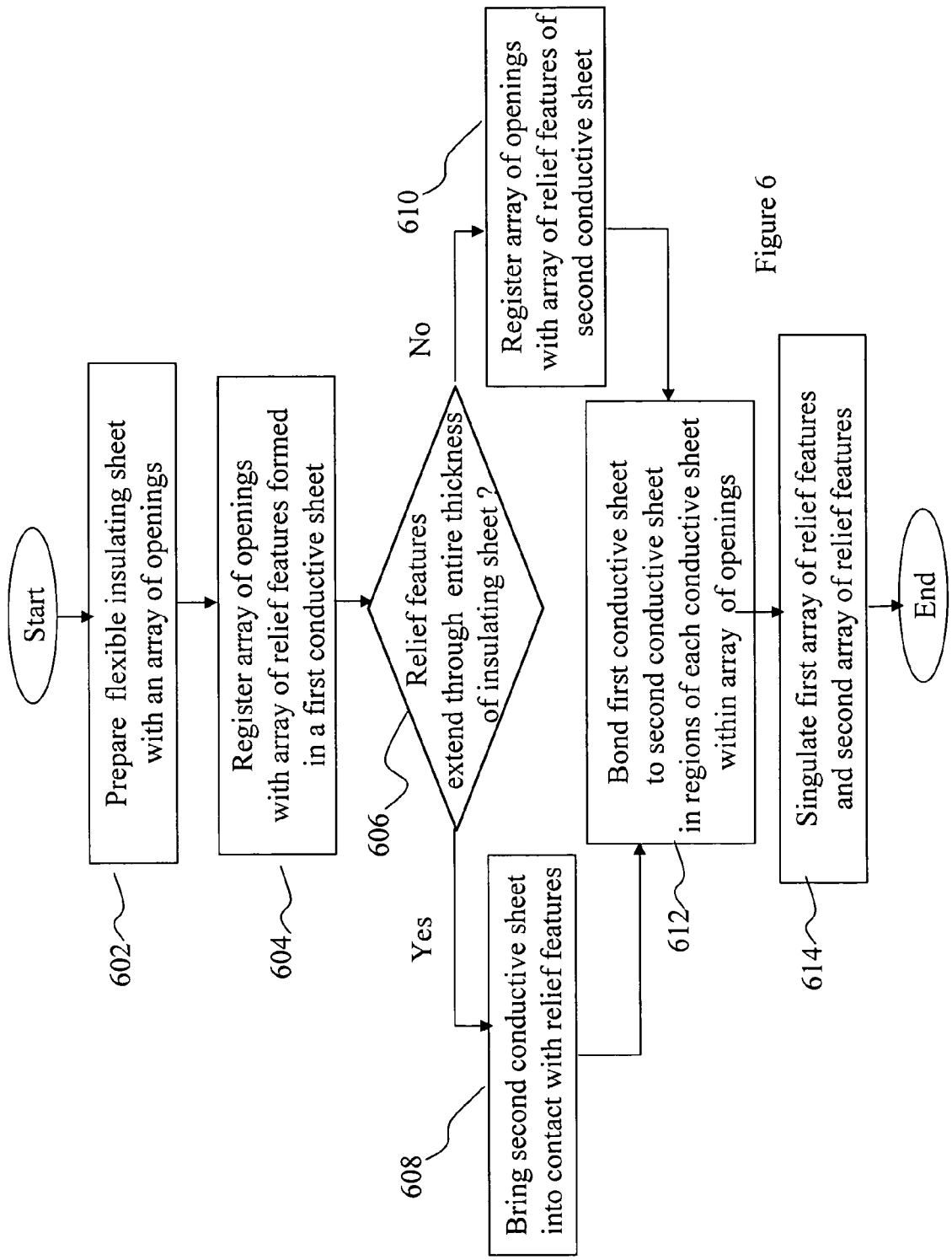
FIG. 6 depicts exemplary steps in a method for making an electrical connector, according to one implementation of the invention.

In the discussion to immediately follow, an exemplary aspect of the present invention will be described in connection with an exemplary method 600 for making an electrical connector, as shown in FIG. 6. Different variations of this method can be employed, for instance, to produce the exemplary electrical connectors 200 and 400 of FIGS. 2 and 4, respectively. FIGS. 7-13c show features of the electrical connector at different steps involved in method 600.

As shown in FIG. 6, in step 602, a flexible insulating sheet is prepared with an array of openings. Any flexible insulating sheet can be used, but in one example, the insulating sheet is a polymer that is a good electrical insulator. The sheet thickness of the flexible insulating sheet can vary, but in one example is less than about 0.5 mils and greater than about 6 mils. In one specific example, the flexible insulating sheet is a Mylar® sheet.

Figure 7:
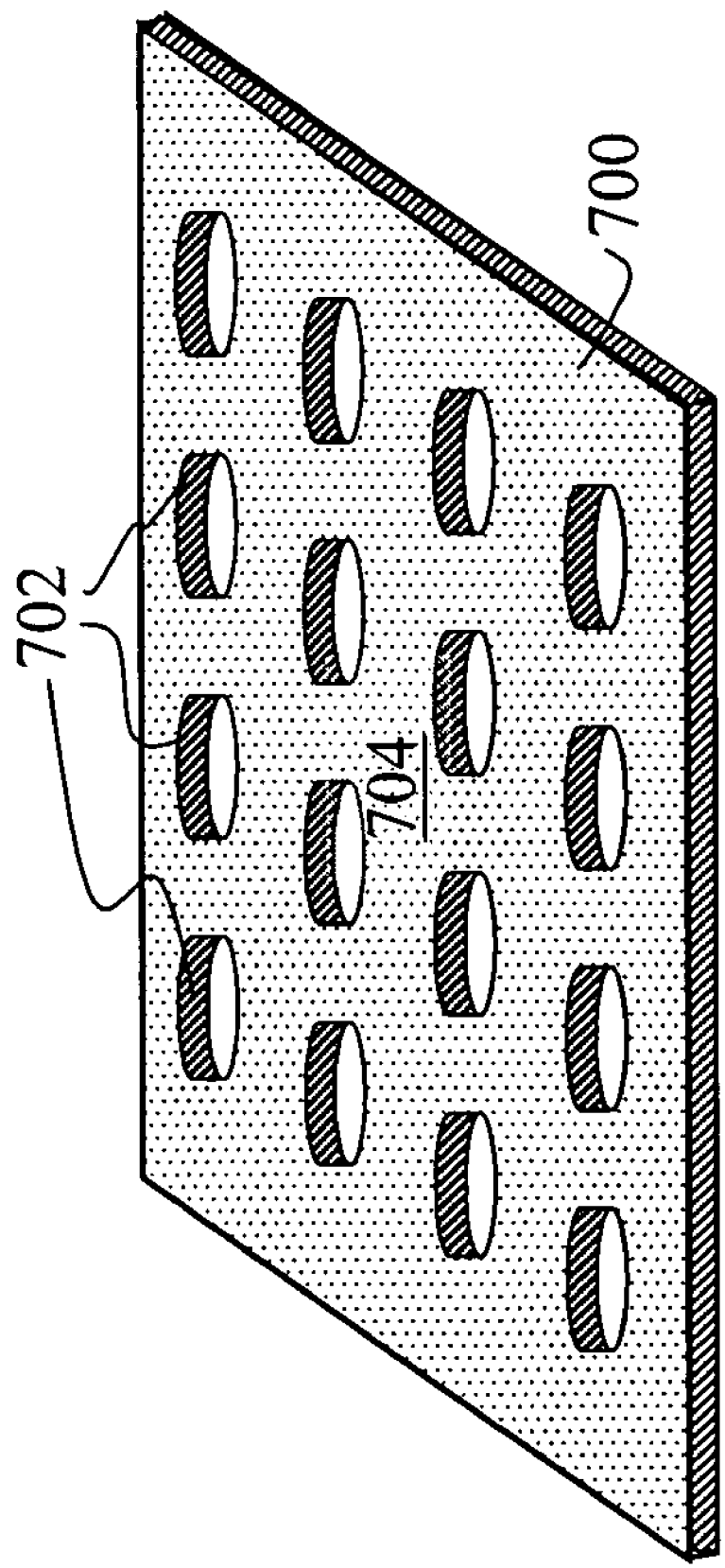
FIG. 7 illustrates a flexible insulating sheet arranged according to one configuration of the invention.

Referring to FIG. 7, a plurality of holes (or "openings") 702 is made in the flexible insulating sheet 700 by cutting or punching. In one aspect, the openings 702 are spaced in an array 704 according to a layout of contact elements to be formed on sheet 700. The openings encompass the entire thickness of flexible insulating sheet 700, thus forming through-holes in the sheet.

In step 604 of FIG. 6, the array of openings in the flexible insulating sheet is registered with an array of projections formed in a first conductive sheet. As mentioned above, the conductive sheet is used to form contact elements of the electrical connector and can be made of any metallic material. Examples of appropriate material for the conductive sheet include a copper alloy, metal-coated titanium, or gold alloy coated stainless steel. As discussed below, a given projection can itself be unpatterned or can include, for instance, a via region or a preformed contact element extending from a bottom surface of the projection.

FIGS. 8a-8c illustrate registration of conductive sheet 802 with array 704. Conductive sheet 802 includes an array 804 of projections 806 that constitute raised portions of the conductive sheet. Array 804 is configured to produce positions of projections 806 that can be inserted within openings 702 of array 704. Formation of the projections is discussed further with respect to FIG. 15 below. As illustrated in FIG. 8a, holes 702 are arranged to align with projections 806. Conductive sheet 802 is brought into contact with flexible insulating sheet 700, as illustrated in FIGS. 8b and 8c, such that projections 806 are accommodated within openings 702.

FIGS. 9a and 9b illustrate a top and bottom perspective view of an exemplary variation of conductive sheet 802, according to one configuration of the invention. In this variation, top side 900 of conductive sheet 902 comprises an array 904 of projections 906. Vias 908 extend through the entire thickness (not shown) of conductive sheet 902. As illustrated in FIG. 9b, elastic portions 910 extend from bottom surface 912. In the example shown, elastic portions 910 correspond to spring arm portions of contacts to be formed, such as spring arms 308 illustrated in FIG. 3a. Elastic portions 910 are configured as two spring arms extending from a bottom surface 912 of projections 906 in a periphery region of a via 908 that extends through the thickness of the projection. However, any convenient elastic structure can be used instead of the two spring arms for formation of elastic contact structures.

In other configurations, conductive sheets can comprise projections without vias and without elastic portions extending from a bottom side of the projections. Formation of projections 906 is discussed in more detail with respect to Figure below. Additionally, formation of elastic contact structures, such as portions 910, is discussed below and in detail in U.S. application Ser. No. 10/412,729.

After registration of projections of a conductive sheet with the openings in the flexible insulating sheet, a second conductive sheet is brought into contact with the flexible insulating sheet, from a side the insulating sheet opposite to where the first conductive sheet is situated. The second conductive sheet can be made of substantially similar material as the first conductive sheet, but need not contain the same material. Depending on the placement of the projections of the first conductive sheet within the openings of the flexible insulating sheet, the configuration of the second conductive sheet can be varied.

Figure 10B:
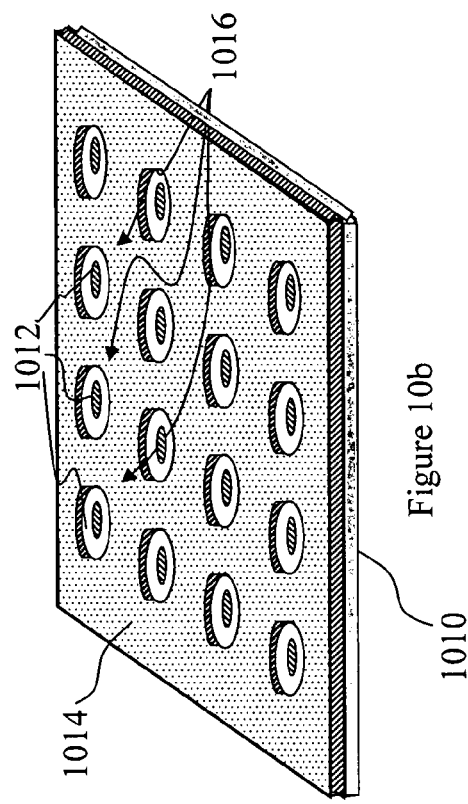
FIGS. 10a and 10b illustrate two of different possible configurations of a connector after an intermediate step in the method of FIG. 6.
Figure 10A:
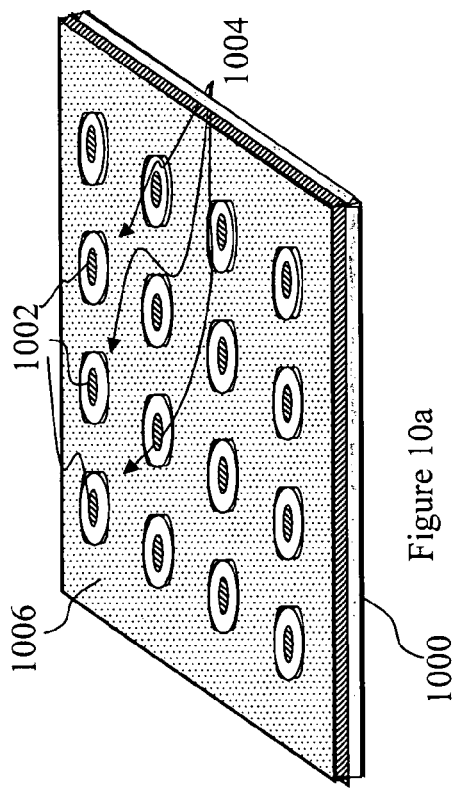

FIGS. 10a and 10b illustrate two different possible configurations after step 604. In FIG. 10a, projections 1002 of conductive sheet 1000 located within openings 1004 extend substantially through the entire thickness of flexible insulating sheet 1006. In FIG. 10b, projections 1012 of conductive sheet 1010 extend only partially through the thickness of flexible insulating sheet 1014 in openings 1016.

In step 606 of FIG. 6, if the array of registered projections extends substantially through the entire thickness of the flexible insulating sheet, then the process moves to step 608. In step 608, a second conductive sheet is brought into contact with the top surfaces of conductive projections in the array of registered projections. In one example, illustrated in FIG. 10a, the top surfaces of projections are essentially flush with the surface of the flexible insulating sheet that is opposite to the surface on which the first sheet rests. Accordingly, a second conductive sheet that is essentially flat and featureless can be brought to rest on both the surface of the flexible insulating sheet, for example sheet 1006, and the tops of the conductive projections, for example, features 1002.

In step 606, if the array of registered projections only extends partially through the thickness of the flexible insulating sheet, the process moves to step 610. In step 610, a second conductive sheet that is provided with an array of projections is registered with the array of openings in the flexible insulating sheet. In this case, the height of the projections of the second conductive sheet is such that the tops of the projections of the first and second conductive sheets are brought into contact when the second sheet is registered with the flexible insulating sheet in a manner similar to that shown in FIGS. 8a-8c.

FIGS. 11a and 11b illustrate exemplary registration of projections 1108 located on "top" surface 1109 (facing downward in FIG. 11a) of conductive sheet 1110 with an insulating sheet 1106 that already contains projections 1102 of conductive sheet 1100 that are registered within openings 1104. In this example, conductive sheet 1110 contains elastic portions 1116 that are dual spring arms arising from bottom side 1114 and are located on bottom surfaces 1114 of projections 1108.

Figure 12:
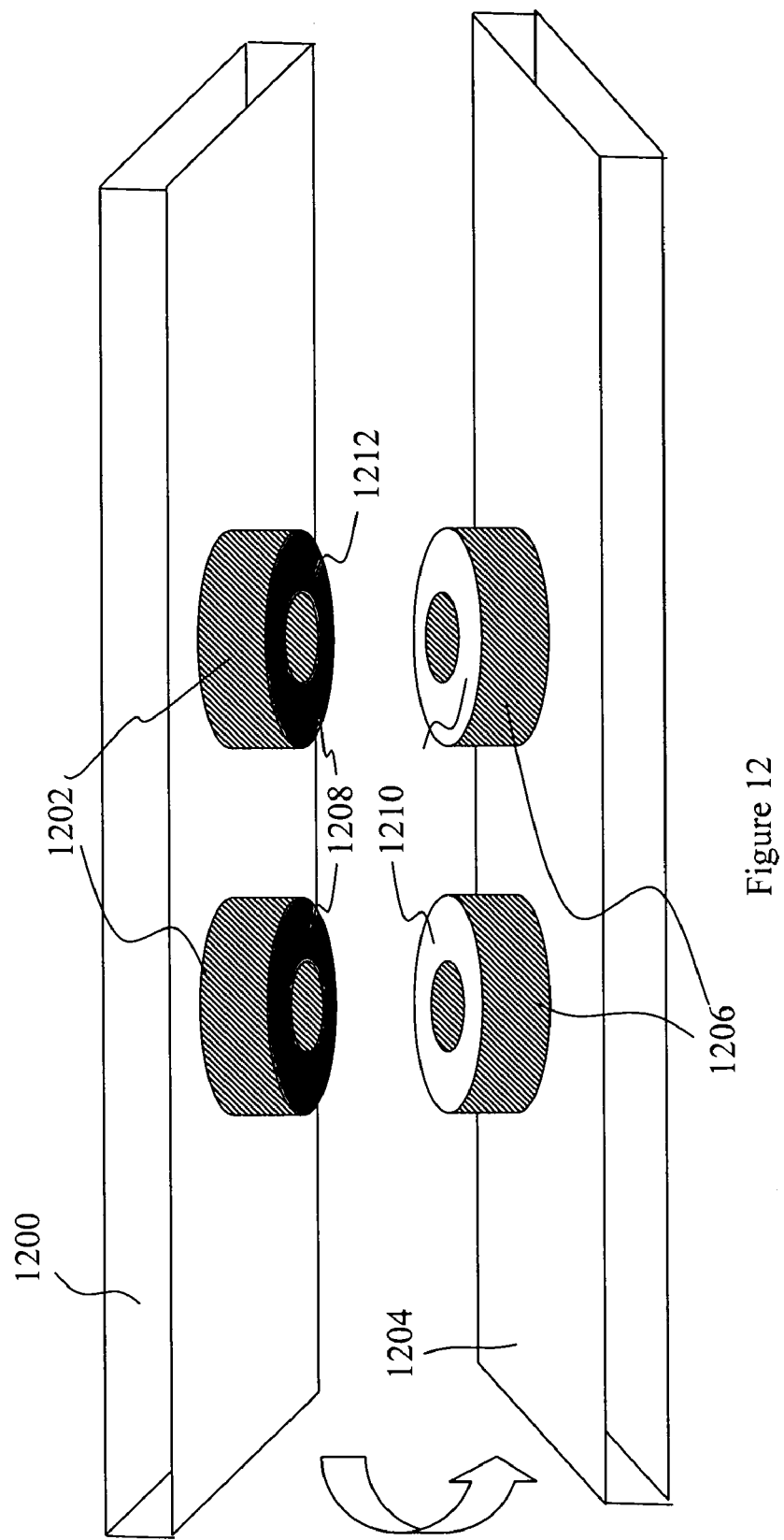
FIG. 12 depicts exemplary bonding of conductive sheets according to the method of FIG. 6.

In step 612 of FIG. 6, the first and second conductive sheets are bonded to each other. As illustrated in FIG. 12, the conductive sheets are bonded to each other at regions where the two sheets contact each other within the array of openings in the flexible insulating sheet. Bonding can take place using any convenient method for bonding metallic surfaces. Known methods that can be employed include applying conductive paste on one or both of the surfaces of the conductive sheets in the regions to be bonded, and then applying heat. Alternatively, a conductive metallic layer, such as a low melting point metal, alloy, or solder can be applied to the conductive sheets in bonding regions before heating.

After bonding, a good conductive path is established between the two conductive sheets in each of the openings of the array of openings. Depending on details of the bonding process, a distinct conductive interface layer between the two conductive sheets may or may not remain after bonding.

In FIG. 12, which for clarity purposes shows only the two conductive sheets 1200 and 1204, respective projections 1202 and 1206 come into contact with each other in top annular surfaces 1208 and 1210. In this example, surface 1208 is provided with a thin metallic bonding layer 1212 that interdiffuses into projections 1202 and 1206 when the latter are brought into contact and heated.

In step 614 of FIG. 6, the bonded conductive layers are singulated using any convenient process to form arrays of isolated contacts in a flexible insulating carrier, such as illustrated in FIGS. 13a-13c. In the example illustrated, a blanket mask coating 1302 is applied to a surface of a conductive sheet 1300 bonded to a second conductive sheet 1304 through a flexible insulator 1306. Blanket coating 1302 can be applied to both conductive sheets 1300 and 1304 at the same time. In one example, blanket mask coating 1302 is conformally applied to coat features such as contact arms to protect the latter from etching when defining the contact element base portions. In FIG. 13b, blanket mask layer 1302 is patterned using, for example, a standard lithographic process to create contact-defining mask features 1310. In one example, mask features 1310 are circular in shape, but can also be oval, square, or have combinations of features, such as a flattened circle having four straight portions that are mutually arranged at 90 degree angles and connected by portions of a circular arc. A similar patterning process can be employed on conductive sheet 1304 at the same time, if desired. In FIG. 13c, etching takes place to selectively remove conductive layer 1300 (and, in one example, conductive layer 1304), followed by removal of mask features 1310, leaving contact base portions 1312 remaining.

Figure 14:
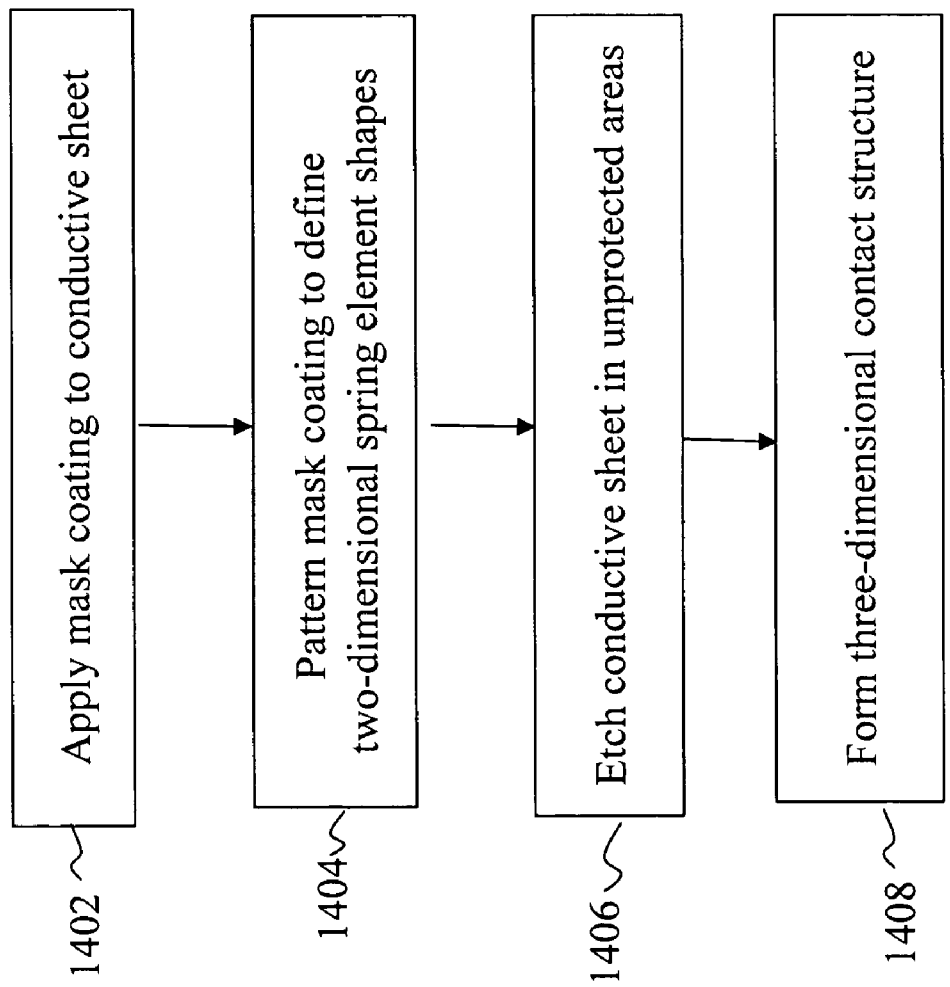
FIG. 14 illustrates an exemplary method of fabricating spring elements that form the connector elastic portions, according to one aspect of the invention.

FIG. 14 illustrates exemplary steps involved in a method of fabricating spring elements that form the connector elastic portions, such as elastic portions 308 in FIG. 3a, according to one implementation of the invention. In step 1402, a mask coating is applied to a conductive sheet. In step 1404, the mask coating is patterned to define a two dimensional mask coating pattern of a spring element. For example, the two dimensional pattern could comprise substantially the same shape as that of contact 104 shown in FIG. 2a. In step 1406, the conductive sheet is etched so that regions not protected by the mask layer are completely etched away. A two dimensional contact structure having, for example, two conductive contact arms, is thus formed. In step 1408, the two dimensional contact structure is formed into a three dimensional contact structure. Detailed examples of processes for forming the contacts in three dimensions are disclosed in U.S. application Ser. No. 10/412,729.

Figure 15:
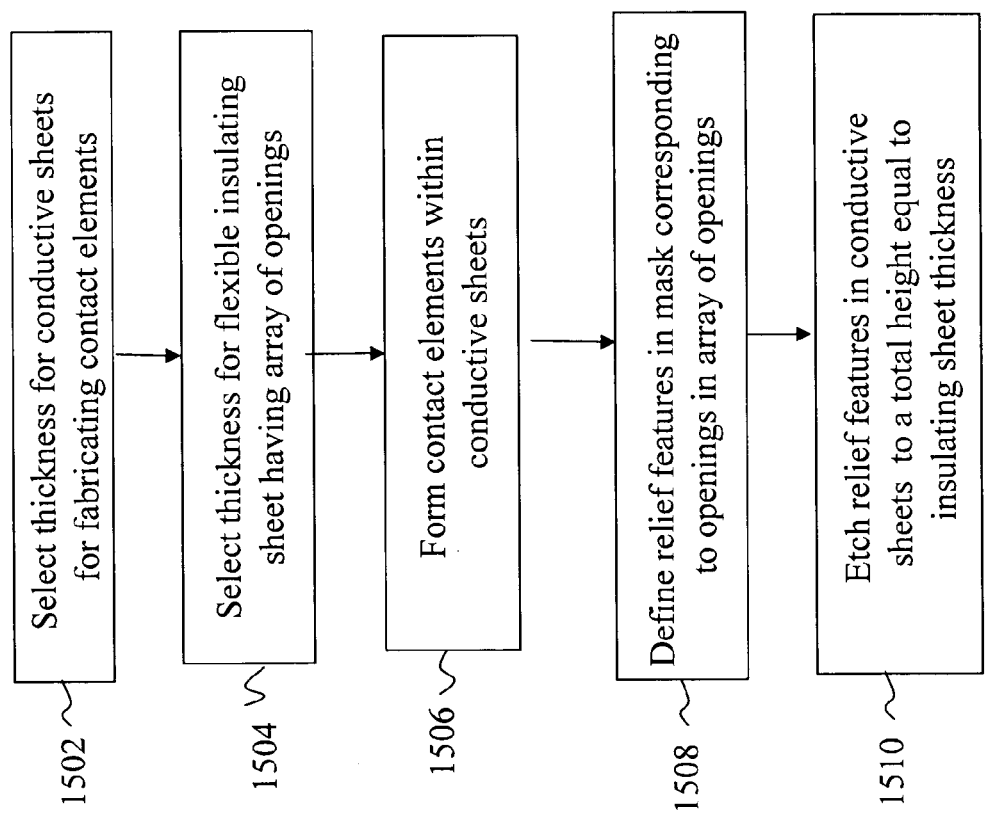
FIG. 15 illustrates an exemplary method for forming an array of flexible contacts having minimal electrical path length, according to one aspect of the invention.

In the above fabrication processes, arrays of flexible electrical contacts providing electrical connection along a minimal electrical path can be anchored to an insulating flexible carrier sheet without bonding the electrical contacts directly to the insulating sheet. FIG. 15 illustrates exemplary steps involved in forming an array of flexible contacts having minimal electrical path length. In step 1502, an appropriate thickness of conductive sheets to fabricate the contact elements is chosen. The conductive sheet thickness can be chosen based on desired elastic or electrical properties of contacts to be formed, end use criteria for the flexible contacts, processing considerations, or other criteria. The thickness of two conductive sheets used to form the contacts need not be the same.

In step 1504, a sheet thickness of a flexible insulating sheet that is to act as the carrier for the contacts is chosen. Because rim portions surrounding openings in the flexible sheet are to fit into a channel formed in the contacts, as illustrated in FIG. 2*b*, the insulating sheet thickness can be chosen to be less than the sum of conductive sheet thickness of the two sheet use to form the electrical contacts.

In step 1506, contact elements are formed within the conductive sheets, as described above.

In step 1508, features are defined in a mask applied to the conductive sheet or sheets. The shape and size of features defined in the mask are designed to produce projections than can fit within the openings of the flexible insulating sheet.

In step 1510, projections are etched into the conductive sheet or sheets. Referring again to FIG. 2*b*, the total height of projections etched in opposing conductive sheets corresponds to a depth D, which can be approximately equal to the thickness of the flexible insulating sheet. When the two conductive sheets are joined in regions within the openings of the flexible insulating sheet, a channel forms that can accommodate the rim portion of the openings. As mentioned above, the projections can be etched in one or both conductive sheets, and need not have the same depth if etched in both sheets.

In the above manner, once a thickness and contact structure of the conductive sheets is chosen, the thickness of a flexible insulating carrier sheet to hold the contacts can be varied over a range without affecting the electrical path length of the contacts. For example, if two 2 mil thick conductive sheets are chosen to form contacts in a flexible conductor of the invention, a channel of up to about 3 mils thickness can easily be formed by patterning the two conductive sheets and joining them as described above. Accordingly, a polymer sheet thickness for the insulating carrier can be chosen in the range of 0.5 mils or less up to about 3 mils or so to be used to form a connector with 2 mil thick conductive sheets. As evident from FIG. 3*a*, such variations in thickness of a channel region of the connector will not affect the electrical path length or current traveling between opposing arms on the top and bottom of the connector.

The foregoing disclosure of configurations of the present invention has been presented for purposes of illustration and description. It is not intended to be exhaustive or to limit the invention to the precise forms disclosed. Many variations and modifications of the configurations described herein will be apparent to one of ordinary skill in the art in light of the above disclosure. The scope of the invention is to be defined only by the claims appended hereto, and by their equivalents.

Further, in describing representative configurations of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. An electrical connector, comprising:
   flexible dielectric sheet defining one or more openings through the flexible dielectric sheet;
   one or more conductive connectors, each conductive connector mounted in an opening of the flexible dielectric sheet, each conductive connector having a surface portion on each side of the flexible dielectric sheet, the surface portion having a recess in its periphery that defines an area of the flexible dielectric sheet situated within the recess; and
   the conductive connectors each comprising a base portion having a planar region that has an outer surface and a spring element extending above the planar region.

2. The electrical connector of claim 1, the spring element comprising one or more elastic arms extending above the outer surface of the base portion on each of the two sides of the flexible dielectric sheet.

3. The electrical connector of claim 1, the base portion being formed from joining two conductive sheets in an opening, and the base portion having a base portion height determined by a sum of thicknesses of the two conductive sheets.

4. The electrical connector of claim 3, each conductive connector providing a minimum electrical path length defined by a sum of the base portion height and an elastic portion current path.

5. The electrical connector of claim 1, the electrical connector conformable to uneven surfaces such that conductive connectors in one region of the electrical connector can lie in a plane different than that of conductive connectors in another region of the electrical connector.

* * * * *